United States Patent
Lin et al.

(10) Patent No.: US 9,658,304 B2
(45) Date of Patent: May 23, 2017

(54) MRI METHOD FOR RETROSPECTIVE MOTION CORRECTION WITH INTERLEAVED RADIAL ACQUISITION

(75) Inventors: Wei Lin, Gainesville, FL (US); Feng Huang, Gainesville, FL (US)

(73) Assignee: KONINKLIJKE PHILIPS ELECTRONICS N.V., Eindhoven (NL)

( * ) Notice: Subject to any disclaimer, the term of this patent is extended or adjusted under 35 U.S.C. 154(b) by 730 days.

(21) Appl. No.: 13/810,456

(22) PCT Filed: Jul. 21, 2011

(86) PCT No.: PCT/IB2011/053251
§ 371 (c)(1),
(2), (4) Date: Jan. 16, 2013

(87) PCT Pub. No.: WO2012/011069
PCT Pub. Date: Jan. 26, 2012

(65) Prior Publication Data
US 2013/0119985 A1 May 16, 2013

Related U.S. Application Data
(60) Provisional application No. 61/366,691, filed on Jul. 22, 2010.

(51) Int. Cl.
*G01R 33/563* (2006.01)
*G01R 33/48* (2006.01)
(Continued)

(52) U.S. Cl.
CPC ....... *G01R 33/563* (2013.01); *G01R 33/4818* (2013.01); *G01R 33/4824* (2013.01);
(Continued)

(58) Field of Classification Search
CPC ............ G01R 33/5611; G01R 33/5608; G01R 33/56308; G01R 33/56509;
(Continued)

(56) References Cited

U.S. PATENT DOCUMENTS 6,356,081 B1 3/2002 Misic
6,897,658 B2 5/2005 Belt et al.
(Continued)

FOREIGN PATENT DOCUMENTS

WO 2009134920 A2 11/2009

OTHER PUBLICATIONS

Chandrashekara, Raghavendra, Raad H. Mohiaddin, and Daniel Rueckert. "Analysis of 3-D myocardial motion in tagged MR images using nonrigid image registration." Medical Imaging, IEEE Transactions on 23.10 (2004): 1245-1250.*
(Continued)

*Primary Examiner* — Melissa Koval
*Assistant Examiner* — Rishi Patel

(57) ABSTRACT

A motion-corrected magnetic resonance imaging method comprises: sequentially acquiring a plurality of interleaved magnetic resonance radial acquisition datasets using a magnetic resonance scanner; reconstructing each magnetic resonance radial acquisition dataset into a corresponding image to generate a set of images, the reconstructing including expanding radial k-space lines of the magnetic resonance radial acquisition dataset into corresponding radial bands in k-space using a generalized auto-calibrating partially parallel acquisition (GRAPPA) operator; selecting a reference image from the set of images; performing three-dimensional spatial registration of each image of the set of images except the reference image with respect to the reference image to
(Continued)

Figure 1:
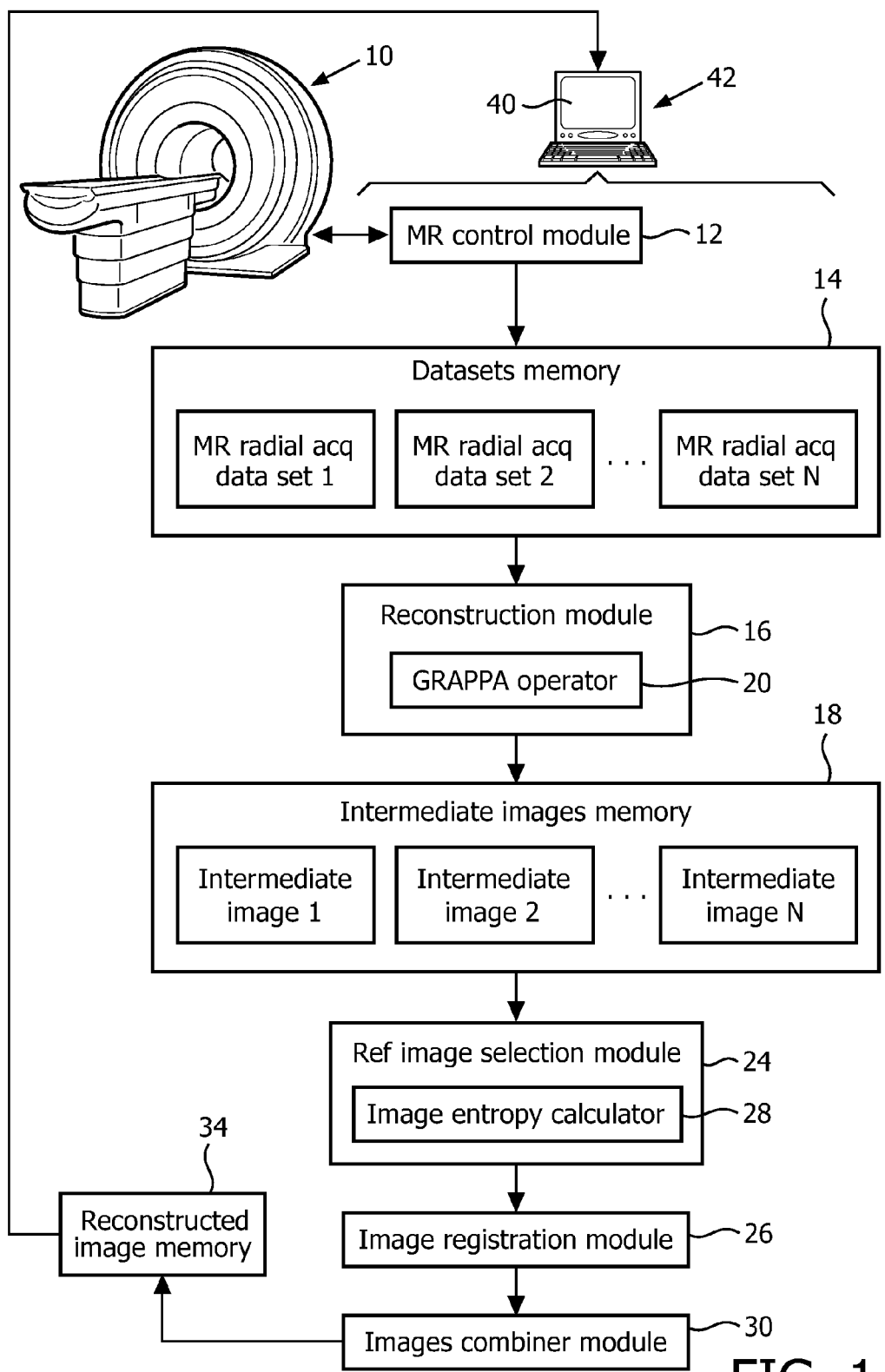

generate a spatially registered set of images; and combining the spatially registered set of images to generate a motion corrected image.

20 Claims, 5 Drawing Sheets

(51) Int. Cl.
  *G01R 33/56* (2006.01)
  *G01R 33/561* (2006.01)
  *G01R 33/565* (2006.01)

(52) U.S. Cl.
  CPC ........ *G01R 33/5611* (2013.01); *G01R 33/561* (2013.01); *G01R 33/5608* (2013.01); *G01R 33/56509* (2013.01)

(58) Field of Classification Search
  CPC ............ G01R 33/4818; G01R 33/4824; G01R 33/561; G01R 33/563
  USPC .................................. 324/307, 309; 382/131
  See application file for complete search history.

(56) References Cited

U.S. PATENT DOCUMENTS

| | | | |
|---|---|---|---|
| 7,348,776 | B1 | 3/2008 | Aksoy et al. |
| 7,545,966 | B2 | 6/2009 | Lewin et al. |
| 2007/0038073 | A1* | 2/2007 | Mistretta ........................ 600/410 |
| 2009/0087057 | A1 | 4/2009 | Parker et al. |
| 2010/0013475 | A1* | 1/2010 | Kimura .................. A61B 5/055 324/307 |

OTHER PUBLICATIONS

Lin, W., et al. "GRAPPA Operator for Wider RadiaL Band (GROWL)." ISMRM 17th meeting, Apr. 18-24, 2009.*

Arunachalam, A., et al.; Self-Calibrated GRAPPA Method for 2D and 3D Radial Data; 2007; MRM; 57(5)931-938.

Atkinson, D., et al.; Automatic Correction of Motion Artifacts in Magnetic Resonance Images Using an Entropy Focus Criterion; 1997; IEEE Trans. on Medical Imagine; 16(6)903-910.

Ge, L., et al.; Free-Breathing Myocardial Perfusion MRI Using SW-CG-HYPR and Motion Correction; 2010; MRM; 64:1148-1154.

Griswold, M. A., et al.; Rapid Evaluation of Cardiac Function Using Undersampled Radial TrueFISP with GRAPPA; 2004; Proc. Intl. Soc. Mag. Reson. Med.; pp. 637.

Griswold, M. A., et al.; Generalized Autocalibrating Partially Parallel Acquisitions (GRAPPA); 2002; MRM; 47:1202-1210.

Kim, S., et al.; Automatic correction of in-plane bulk motion artifacts in self-navigated radial MRI; 2008; Magnetic Resonance Imaging; 26(3)367-378.

Lin, W., et al.; GRAPPA Operator for Wider Radial Bands (GROWL) with Optimally Regularized Self-Calibration; 2010; MRM; 64:757-766.

Lin, W., et al.; GRAPPA Operator for Wider Radial Bands (GROWL); 2009; Proc. Intl. Soc. Mag. Reson. Med.; 17:4553.

Lin, W., et al.; Optimally Regularized GRAPPA/GROWL with Experimental Verifications; 2010; Proc. Intl. Soc. Mag. Reson. Med.; 18:2874.

Lin, W., et al.; High Temporal Resolution Radial Motion Correction with GROWL; 2010; Proc. of 18th Annual Meeting of ISMRM, Stockholm, Sweden; 493.

McLeish, K., et al.; Free-Breathing Radial Acquisitions of the Heart; 2004; MRM; 52:1127-1135.

Pipe, J. G.; Motion Correction with PROPELLER MRI: Application to Head Motion and Free-Breathing Cardiac Imaging; 1999; MRM; 42:963-969.

Skare, S., et al.; An Auto-Calibrated, Angularly Continuous, Two-Dimensional GRAPPA Kernel for Propeller Trajectories; 2008; MRM; 60:1457-1465.

* cited by examiner

MRI METHOD FOR RETROSPECTIVE MOTION CORRECTION WITH INTERLEAVED RADIAL ACQUISITION

The following relates to the magnetic resonance imaging arts, medical imaging arts, and related arts.

Three-dimensional magnetic resonance (MR) imaging of a human or other animate subject can provide useful information. Such imaging is used for medical or veterinary diagnosis, for medical or veterinary clinical analysis, for monitoring or assessment of a known medical or veterinary condition in a subject, for medical or veterinary screening tasks, and so forth. However, subject motion can be a problem in the case of animate subjects. Likelihood of subject motion increases with increasing time duration of the MR data acquisition.

A three dimensional imaging dataset can be acquired by either performing multi-slice imaging in which the acquisition of a plurality of spaced-apart parallel slices are interleaved into a single MR excitation repeat time (TR). Alternatively, a three dimensional imaging dataset can be acquired by employing a slice-encoding inner loop. In either case, the imaging data are organized into slices, and the subject motion may be either in the "in-slice" plane, or may be "through-plane" motion in a direction generally transverse to the slices. In-slice motion can sometimes be compensated by shifting or rotating imaging data acquired after a motion event. Data affected by through-plane motion is generally discarded. However, in some application such as head imaging, substantial through-plane motion is a relatively common occurrence, and discarding data affected by such through-plane motion is problematic.

Radial imaging is sometimes employed to facilitate motion correction. Radial imaging provides a "built-in" oversampling of central k-space region, which can be used to assess data-consistency, to provide self-gating, and for correcting rigid or non-rigid subject motion. However, there is a tradeoff between temporal resolution and robustness for radial motion correction, in that more radial lines enhance robustness of the motion correction but reduce temporal resolution for the motion correction.

The following provides new and improved apparatuses and methods as disclosed herein.

In accordance with one disclosed aspect, a method comprises: sequentially acquiring a plurality of interleaved magnetic resonance radial acquisition datasets using a magnetic resonance scanner; reconstructing each magnetic resonance radial acquisition dataset into a corresponding image to generate a set of images; spatially registering the set of images; and combining the spatially registered set of images to generate a motion corrected image.

In accordance with another disclosed aspect, a method comprises: sequentially acquiring a plurality of interleaved magnetic resonance radial acquisition datasets using a magnetic resonance scanner; reconstructing each magnetic resonance radial acquisition dataset into a corresponding image to generate a set of images, the reconstructing including expanding radial k-space lines of the magnetic resonance radial acquisition dataset into corresponding radial bands in k-space using a generalized auto-calibrating partially parallel acquisition (GRAPPA) operator; selecting a reference image from the set of images; performing three-dimensional spatial registration of each image of the set of images except the reference image with respect to the reference image to generate a spatially registered set of images; and combining the spatially registered set of images to generate a motion corrected image.

In accordance with another disclosed aspect, a method comprises: sequentially acquiring a plurality of interleaved magnetic resonance radial acquisition datasets using a magnetic resonance scanner; reconstructing each magnetic resonance radial acquisition dataset into a corresponding image to generate a set of images; selecting a reference image from the set of images as the image having lowest entropy; performing spatial registration of each image of the set of images except the reference image with respect to the reference image to generate a spatially registered set of images; and combining the spatially registered set of images to generate a motion corrected image.

In accordance with another disclosed aspect, a method as set forth in any one of the three immediately preceding paragraphs is disclosed, further comprising displaying or printing the motion-corrected image. In accordance with another disclosed aspect, a method as set forth in any one of the three immediately preceding paragraphs is disclosed, wherein the reconstructing, spatial registering, and combining are performed by a digital processor. In accordance with another disclosed aspect, a digital processor configured to perform a method as set forth in any one of the three immediately preceding paragraphs is disclosed. In accordance with another disclosed aspect, a storage medium is disclosed storing instructions executable by a digital processor to perform a method as set forth in any one of the three immediately preceding paragraphs.

One advantage resides in improved motion compensation in MR images.

Another advantage resides in faster acquisition of motion compensated MR images.

Another advantage resides in providing for retrospective tradeoff between motion correction robustness and temporal resolution.

Further advantages will be apparent to those of ordinary skill in the art upon reading and understanding the following detailed description.

FIG. 1 diagrammatically shows an imaging system configured to perform motion-corrected magnetic resonance imaging.

Figure 2:
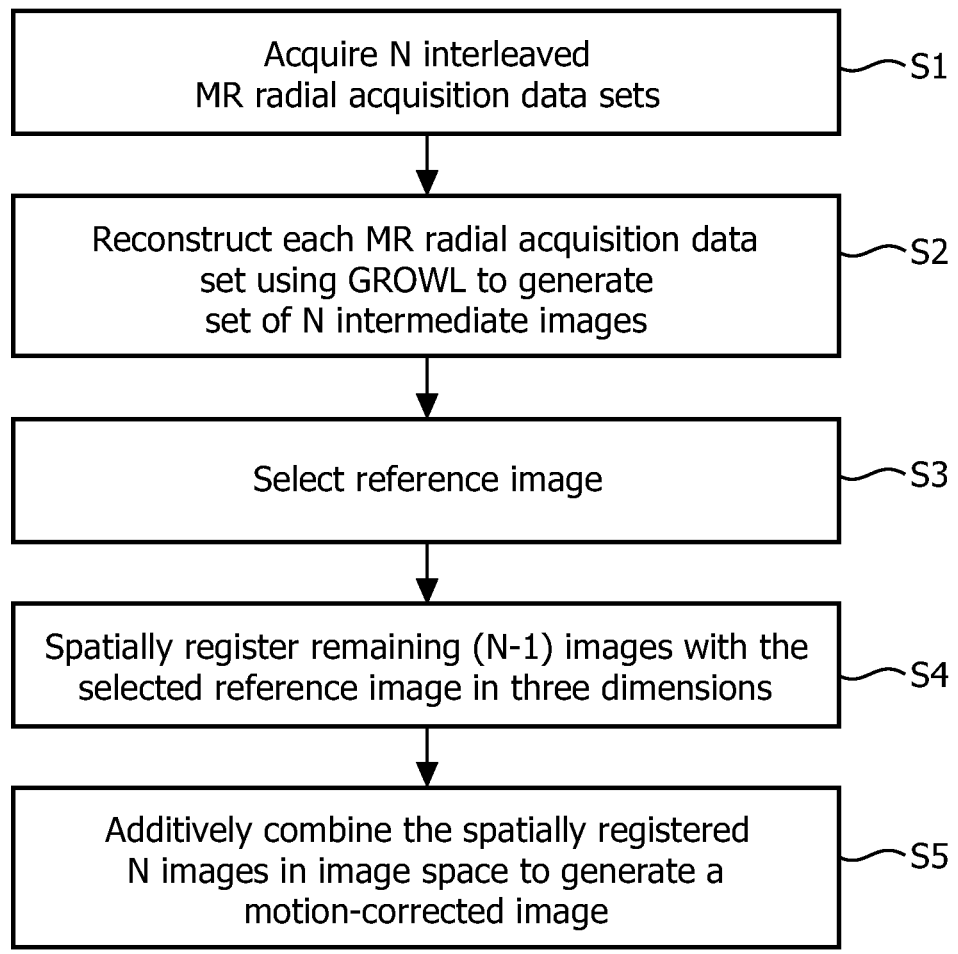

FIG. 2 diagrammatically shows a motion-corrected magnetic resonance imaging method suitably performed by the imaging system of FIG. 1.

Figure 3:
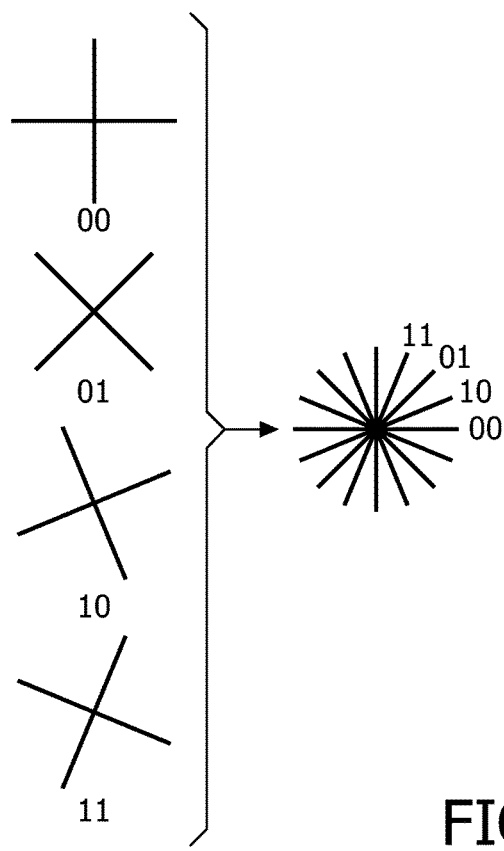

FIG. 3 diagrammatically shows a set of four interleaved magnetic resonance radial acquisition datasets and the resulting combined dataset.

Figure 4:
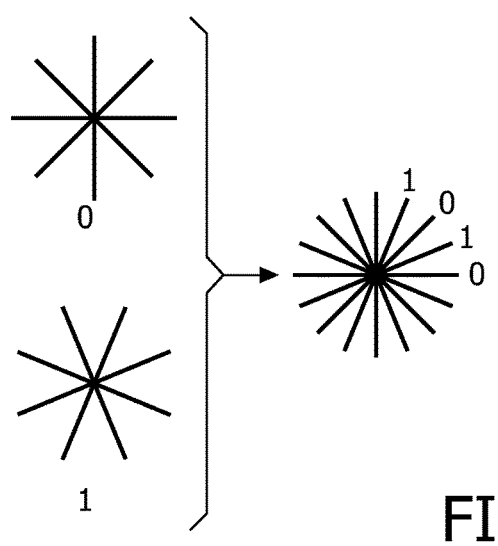

FIG. 4 diagrammatically shows a set of two interleaved magnetic resonance radial acquisition datasets and the resulting combined dataset.

Figure 5:
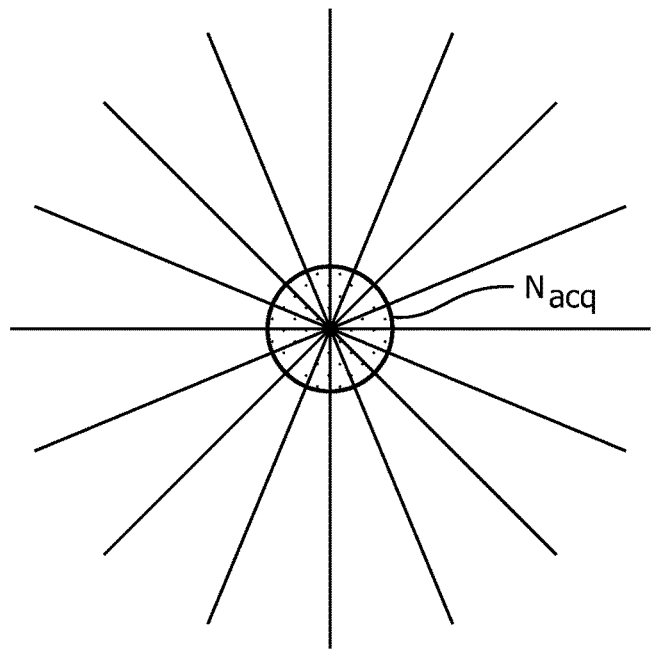

FIG. 5 diagrammatically shows a magnetic resonance radial acquisition dataset with an indication of the region within which the Nyquist criterion is satisfied.

Figure 6:
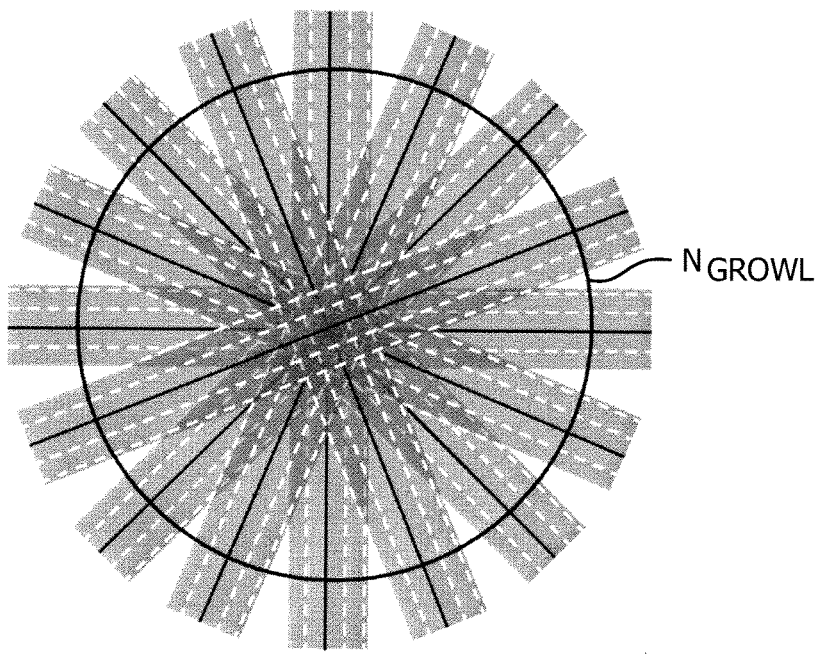

FIG. 6 diagrammatically shows the magnetic resonance radial acquisition dataset of FIG. 5 after expanding each radial k-space line into a radial band in k-space using a generalized auto-calibrating partially parallel acquisition (GRAPPA) operator, with an indication of the region within which the Nyquist criterion is satisfied.

Figure 7:
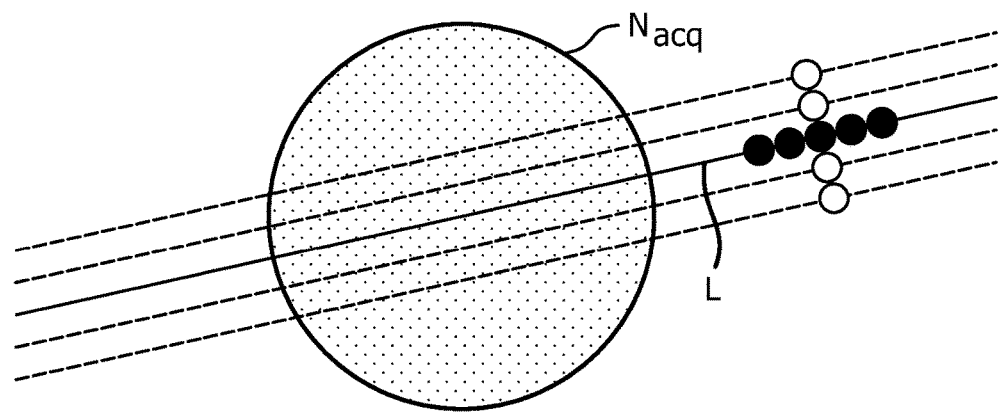

FIG. 7 diagrammatically shows the GRAPPA extrapolation used to convert the data of FIG. 5 to the data of FIG. 6.

Figure 8:
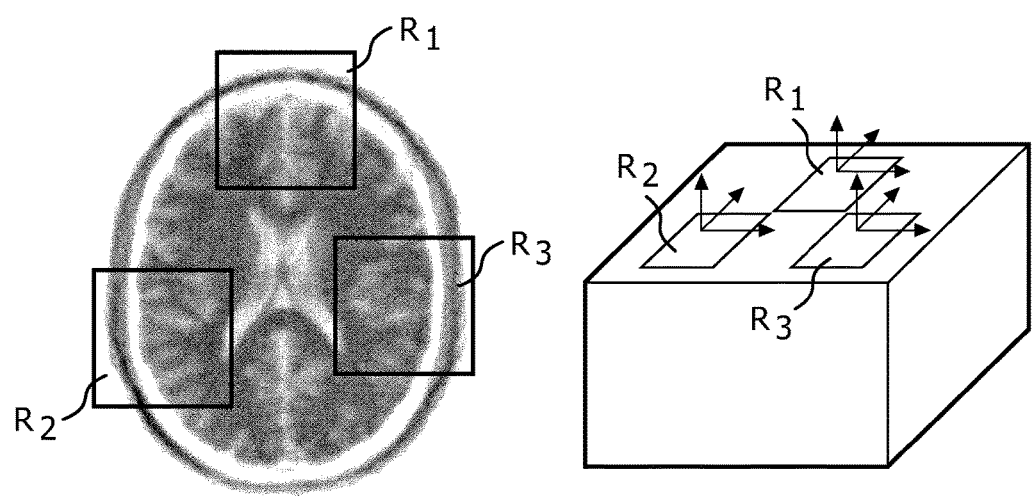

FIG. 8 diagrammatically shows a plurality of spaced-apart regions of interest at each of which relative motion between the image and the reference image is determined in order to perform motion correction.

With reference to FIGS. 1 and 2, an imaging system and method, respectively, are shown for performing motion-corrected imaging. The imaging system includes a magnetic resonance (MR) scanner 10, such as an illustrated Achieva™ MR scanner (available from Koninklijke Philips Electronics N.V., Eindhoven, The Netherlands), or an Intera™ or Panorama™ scanner (both also available from Koninklijke Philips Electronics N.V.), or another commercially available MR scanner, or a non-commercial MR scanner, or so forth. In a typical embodiment, the MR scanner includes internal components (not illustrated) such as a superconducting or resistive main magnet generating a static ($B_0$) magnetic field, sets of magnetic field gradient coil windings for superimposing selected magnetic field gradients on the static magnetic field, a radio frequency excitation system for generating a radio frequency ($B_1$) field at a frequency selected to excite magnetic resonance (typically $^1H$ magnetic resonance, although excitation of another magnetic resonance nuclei or of multiple magnetic resonance nuclei is also contemplated), and a radio frequency receive system including a radio frequency receive coil array, or a plurality of receive coils, for detecting magnetic resonance signals emitted from the subject.

In an magnetic resonance (MR) acquisition operation S1 (see FIG. 2), the MR scanner 10 is controlled by a magnetic resonance (MR) control module 12 to sequentially acquire a plurality of interleaved magnetic resonance (MR) radial acquisition datasets which are stored in a datasets memory 14. Without loss of generality, the number of acquired MR radial acquisition datasets is denoted as N where N is a positive integer greater than one. Each MR radial acquisition dataset includes n radial k-space lines and has n-fold rotational symmetry in k-space, where n is a positive integer greater than one. The plurality of interleaved MR radial acquisition datasets thus includes N×n radial k-space lines, and the interleaving is selected such that this combined set of N×n radial k-space lines has N×n fold rotational symmetry in k-space where N is a positive integer greater than one. The disclosed acquisition S1 employs partial parallel imaging (PPI), and accordingly a plurality (i.e., two or more) receive coils are employed in the acquisition S1.

With continuing reference to FIGS. 1 and 2 and with further reference to FIG. 3, an illustrative example of the acquisition operation S1 is shown, in which the number of interleaved MR radial acquisition datasets is N=4, with each MR radial acquisition dataset including n=4 radial k-space lines. (As used herein, a "radial k-space line" is considered to extend outward from the center of k-space or, alternatively, to begin at a periphery of k-space and extend radially inward to the center of k-space.) The four interleaved MR radial acquisition datasets of illustrative FIG. 3 are denoted by binary notation: MR radial acquisition set "00" is acquired first; MR radial acquisition set "01" is acquired second; MR radial acquisition set "10" is acquired third; and MR radial acquisition set "11" is acquired last. Each MR radial acquisition set has four-fold (i.e., n-fold) rotational symmetry in k-space, while the combined interleaved MR radial acquisition dataset (shown on the righthand side of FIG. 3) has sixteen-fold (i.e., N×n-fold) rotational symmetry in k-space. This illustrative example is an interleaved or "bit-reverse" acquisition scheme.

Because the four interleaved MR radial acquisition datasets are acquired in the order: "00", "01", "10", "11", it follows that subject motion will produce blurring only in the dataset or datasets during which the motion occurs. Additionally, any dataset acquired after a motion event will (in general) have some spatial misalignment as compared with the dataset(s) acquired before the motion event.

With continuing reference to FIG. 3 and with further reference to FIG. 4, by suitable selection of the order of acquisition of the interleaved MR radial acquisition datasets, it is possible to have various groupings of the datasets to provide a retrospective tradeoff between temporal resolution and motion correction robustness. In FIG. 4, the four interleaved MR radial acquisition datasets are grouped into two interleaved MR radial acquisition datasets. Toward this end, the first two acquired datasets "00" and "01" are grouped as a single MR radial acquisition dataset "0" and the second two (subsequently acquired) datasets "10" and "11" are grouped as a single MR radial acquisition dataset "1". Thus, in the case of FIG. 4, N=2 and each MR radial acquisition dataset has n=8 radial k-space lines and 8-fold rotational symmetry in k-space, while the combined dataset (shown on the righthand side of FIG. 3) has N×n=2×8=16 radial k-space lines. The result of the grouping of FIG. 4 (as compared with the grouping of FIG. 3) is more robust motion correction due to the larger number of radial k-space lines (n=8 in FIG. 4 as compared with n=4 in FIG. 3) but poorer temporal resolution due to the fewer number of interleaved datasets (N=2 in FIG. 4 as compared with N=4 in FIG. 3).

With returning reference to FIGS. 1 and 2 and with further reference to FIG. 5, in an operation S2 each of the N interleaved MR radial acquisition datasets is reconstructed by a reconstruction processor 16. This results in generation of N (intermediate) images, which are suitably stored in an intermediate images memory or buffer 18. To enhance temporal resolution, in the illustrative embodiments each MR radial acquisition dataset is undersampled, that is, contains fewer radial k-space lines than would be needed to construct a full image. FIG. 5 diagrammatically denotes this undersampling by showing the combined interleaved MR radial acquisition dataset with a "Nyquist circle" $N_{acq}$ denoting the central k-space region within which the Nyquist criterion is satisfied. Data outside the Nyquist circle $N_{acq}$ is undersampled.

With continuing reference to FIGS. 1, 2, and 5, and with further reference to FIGS. 6 and 7, to accommodate the undersampling, the illustrative reconstruction processor 16 includes implementation of a GRAPPA operator 20 which is applied to expand each radial k-space line into a radial band in k-space. The acronym "GRAPPA" stands for "generalized auto-calibrating partially parallel acquisition". GRAPPA is a partial parallel imaging (PPI) technique that utilizes information provided by simultaneous data acquisition using a plurality of receive elements (e.g., receive coils) with different coil sensitivities to extrapolate acquired k-space data. In the reconstruction operation S2, the GRAPPA operator 20 is used to expand each acquired radial k-space line into a radial band in k-space, as diagrammatically illustrated in FIG. 6. This usage of GRAPPA is also known in the art as the GRAPPA Operator for Wider Radial band ("GROWL") algorithm. Lin et al., "GRAPPA Operator for Wider RadiaL Band (GROWL)", Proc. Intl. Soc. Mag. Reson. Med. 17, page 4553 (2009). In the GROWL algorithm, the GRAPPA operator 20 is used to widen each radial k-space line into a radial band in k-space consisting of several parallel lines, followed by a suitable regridding procedure. Id. This results in an enlarged Nyquist circle $N_{GROWL}$ which is the central k-space region within which the Nyquist criterion is satisfied by the radial bands in k-space. The k-space data within the initial Nyquist circle $N_{acq}$ is used for self-calibration, and is suitably rotated to a Cartesian grid. Id. FIG. 7 diagrammatically shows the process for a single radial k-space line L: the calibration is first performed in the (initial) Nyquist circle $N_{acq}$, followed by GRAPPA extrapolation from the acquired k-space samples (indicated in FIG. 7 by filled black circles lying on the radial k-space line L) to target extrapolated k-space samples (indicated in FIG. 7 by open circles).

In correspondence with the source datasets, subject motion will produce blurring only in the (intermediate) image or images whose dataset was (were) acquired during the motion. Additionally, any image whose dataset was acquired after a motion event will (in general) have some spatial misalignment as compared with image(s) whose dataset(s) was (were) acquired before the motion event. However, such misalignment can be compensated by rigid or non-rigid spatial registration.

With continuing reference to FIGS. 1 and 2, toward this end a reference image selection module 24 selects a reference image from the set of (intermediate) images in an operation S3, and an image registration module 26 spatially registers each image of the set of (intermediate) images except the reference image with the reference image in an operation S4 to generate a spatially registered set of images. Said another way, the reference image selection module 24 selects a reference image from the N images in the operation S3, and the image registration module 26 spatially registers each of the remaining (N−1) images of the set of images with the reference image in the operation S4.

The operation 24 preferably selects a reference image that is not affected, or is minimally affected, by subject motion. In the illustrative embodiment, this is achieved by including an image entropy calculator 28 in the reference image selection module 24, and selecting the reference image as the image having lowest entropy. The principle behind this approach is that motion blurring due to subject motion during acquisition of the MR radial acquisition dataset is generally expected to increase the image entropy in the corresponding reconstructed image.

With continuing reference to FIGS. 1 and 2 and with further reference to FIG. 8, the image registration module 26 can employ substantially any image registration technique in performing the image registration operation S4. In a suitable embodiment diagrammatically shown in FIG. 8, each of the (N−1) images is spatially registered with the reference image in three dimensions. As between a given image and the reference image, the relative motion equals the misalignment between the image and the reference image. As diagrammatically shown in FIG. 8, with both in-plane relative motion and through-plane relative motion are determined at each of a plurality of spaced-apart regions of interest, namely three regions of interest (ROI) $R_1$, $R_2$, $R_3$ in the illustrative example of FIG. 8. In FIG. 8, the three regions of interest (ROI) $R_1$, $R_2$, $R_3$ are shown both in an axial slice of an illustrative head image (lefthand side of FIG. 8) and in a diagrammatic perspective view (righthand side of FIG. 8). Although three ROI $R_1$, $R_2$, $R_3$ are shown in the illustrative example, more or fewer ROI can be used in assessing image misalignment. The number and locations of the ROI should be selected so as to detect most likely rigid and non-rigid subject motions.

In a suitable image correlation method for the motion detection, a two-dimensional correlation between the image and the reference image is determined in image space, and the maximal correlation then yields both detected rotation and translation. Image correlation advantageously can be computed rapidly in k-space. To account for potentially large rotation within each ROI $R_1$, $R_2$, $R_3$, the reference image may optionally be pre-rotated in-plane to various angles prior to the image correlation, and the pre-rotation yielding the best image correlation is then the determined rotation. The detected rotation is suitably corrected by the image registration module 26 in the operation S4 by modifying the radial trajectories, while translational motion is suitably corrected by applying the corresponding linear phase term. The output of the operations S3, S4 is a set of registered (intermediate) images.

With continuing reference to FIGS. 1 and 2, the set of registered (intermediate) images are combined by an images combiner module 30 to form a motion-corrected image in an operation S5. The motion-corrected image is suitably stored in a reconstructed image memory 34, and is optionally displayed on the display 40 of a computer 42, and/or printed using a suitable printing device, and/or communicated via the Internet or a local medical network, or otherwise utilized.

In the illustrated embodiment, control and data processing modules 12, 16, 24, 26, 28 and memories 14, 18, 34 are embodied by the illustrative computer 42 whose processor (which include one or more of a multi-core processor or other parallel processing digital processing device, a single-core processor, a graphical processing unit (GPU), or so forth) is programmed to implement the control and processing functions of the modules 12, 16, 24, 26, 28 and which has a hard drive, optical drive, random access memory (RAM), or other storage medium implementing the memories 14, 18, 34 and/or storing instructions executable by the computer to perform the control and processing functions of the modules 12, 16, 24, 26, 28. The illustrative computer 42 also has the illustrative display 40 for displaying MR images and other visual information. In other embodiments, a dedicated MR controller, MR reconstruction system, or other digital device or devices is employed to embody the processing and/or storage 12, 14, 16, 18, 24, 26, 28, 34.

The disclosed motion-corrected imaging techniques have been implemented in an illustrative in vivo motion corrected head imaging experiment. In this experiment, a healthy volunteer was scanned on a 3.0T Achieva™ MR scanner using an eight-channel head coil (available from Invivo, Gainesville, Fla.) and a multi-slice two-dimensional radial gradient echo sequence. A bit-reversed acquisition sequence as per FIG. 3 was employed (but not necessarily with the same values of n and N as in FIG. 3). As noted with reference to FIG. 4, the bit-reversed scheme provides flexibility in choosing an appropriate temporal resolution retrospectively. Scan parameters were as follows: FOV 230×230 $mm^2$, slice thickness 5 mm, matrix size 256 (readout)×256 (view no.), TR/TE=250/6.9 ms, flip angle=800. To generate a motion-corrupted dataset, the subject was asked to perform head-shaking several times during the scan. Data were grouped into interleaves based on the acquisition order, and GROWL reconstruction as per operation S2 was carried out for each interleaf. The interleaf having lowest image entropy value was chosen as the reference as per operation S3, and the two-dimensional rotation/translation was detected using the image correlation method as per operation S4. The detected rotation was then used to modify the radial trajectories, while translational motion was corrected by applying the corresponding linear phase term. These experiments indicate that the disclosed motion-corrected imaging approaches are suitably used for head imaging using as few as 16 radial lines (that is, N×n=16). Motion trajectory detected from the two-dimensional image correlation shows both continuous and abrupt components, with a rotation range of 5.5° and a translation range of 5 pixels. The entire motion detection and correction procedure took about 20 seconds for these experiments.

This application has described one or more preferred embodiments. Modifications and alterations may occur to others upon reading and understanding the preceding detailed description. It is intended that the application be construed as including all such modifications and alterations insofar as they come within the scope of the appended claims or the equivalents thereof.

Having thus described the preferred embodiments, the invention is now claimed to be:

1. A method comprising:
   sequentially acquiring a plurality of interleaved magnetic resonance radial acquisition datasets using a magnetic resonance scanner;
   reconstructing each magnetic resonance radial acquisition dataset into a corresponding image to generate a set of images, the reconstructing including expanding each radial k-space line into a radial band in k-space;
   spatially registering the set of images; and
   combining the spatially registered set of images to generate a motion-corrected image.

2. The method as set forth in claim 1, wherein:
   each magnetic resonance radial acquisition dataset includes n radial k-space lines and has n-fold rotational symmetry in k-space where n is a positive integer greater than one, and
   the plurality of interleaved magnetic resonance radial acquisition datasets comprises N interleaved radial acquisition datasets and includes N×n radial k-space lines and has N×n fold rotational symmetry in k-space where N is a positive integer greater than one.

3. The method as set forth in claim 2, wherein n is an even integer.

4. The method as set forth in claim 1, wherein the reconstructing of each magnetic resonance radial acquisition dataset comprises:
   expanding each radial k-space line into a radial band in k-space using partial parallel imaging (PPI) that utilizes information provided by simultaneous data acquisition using a plurality of receive elements with different coil sensitivities to extrapolate the acquired k-space data.

5. The method as set forth in claim 1, wherein the reconstructing of each magnetic resonance radial acquisition dataset comprises:
   expanding each radial k-space line into a radial band in k-space using a generalized auto-calibrating partially parallel acquisition (GRAPPA) operator.

6. The method as set forth in claim 1, wherein the reconstructing of each magnetic resonance radial acquisition dataset comprises:
   reconstructing the magnetic resonance radial acquisition dataset using the GRAPPA operator for wider radial band (GROWL) algorithm.

7. The method as set forth in claim 1, wherein the spatial registering comprises:
   selecting a reference image from the set of images; and
   spatially registering each image of the set of images except the reference image with the reference image to generate a spatially registered set of images.

8. The method as set forth in claim 7, wherein the selecting comprises:
   selecting the reference image as the image having lowest entropy.

9. The method as set forth in claim 7, wherein the spatial registering of each image of the set of images with the reference image comprises:
   determining relative motion between the image and the reference image at each of a plurality of spaced-apart regions of interest.

10. The method as set forth in claim 9, wherein the relative motion between the image and the reference image at each region of interest is determined using image correlation.

11. The method as set forth in claim 7, wherein the spatial registering of each image of the set of images with the reference image comprises:
    spatially registering the image with the reference image in three dimensions.

12. The method as set forth in claim 1, wherein the combining comprises:
    additively combining the spatially registered set of images in image space to generate the motion-corrected image.

13. The method as set forth in claim 1, further comprising:
    displaying or printing the motion-corrected image.

14. The method as set forth in claim 1, wherein the reconstructing, spatial registering, and combining are performed by a digital processor.

15. A digital processor configured to perform a method as set forth in claim 1.

16. A non-transitory storage medium storing instructions executable by a digital processor to perform a method as set forth in claim 1.

17. A method comprising:
    sequentially acquiring a plurality of interleaved magnetic resonance radial acquisition datasets using a magnetic resonance scanner;
    reconstructing each magnetic resonance radial acquisition dataset into a corresponding image to generate a set of images, the reconstructing including expanding radial k-space lines of the magnetic resonance radial acquisition dataset into corresponding radial bands in k-space using a generalized auto-calibrating partially parallel acquisition (GRAPPA) operator;
    selecting a reference image from the set of images;
    performing three-dimensional spatial registration of each image of the set of images except the reference image with respect to the reference image to generate a spatially registered set of images; and
    combining the spatially registered set of images to generate a motion-corrected image.

18. The method as set forth in claim 17, wherein the performing of three-dimensional spatial registration of each image comprises:
    determining three-dimensional motion by regional correlation applied to a plurality of regions of interest.

19. A method comprising:
    sequentially acquiring a plurality of interleaved magnetic resonance radial acquisition datasets using a magnetic resonance scanner;
    reconstructing each magnetic resonance radial acquisition dataset into a corresponding image to generate a set of images;
    selecting a reference image from the set of images as the image having lowest entropy;
    performing spatial registration of each image of the set of images except the reference image with respect to the reference image to generate a spatially registered set of images; and
    combining the spatially registered set of images to generate a motion-corrected image.

20. The method as set forth in claim 19, wherein the reconstructing includes expanding radial k-space lines of the magnetic resonance radial acquisition dataset into corresponding radial bands in k-space using a generalized auto-calibrating partially parallel acquisition (GRAPPA) operator.

* * * * *